(12) United States Patent
Navabi

(10) Patent No.: US 9,383,092 B2
(45) Date of Patent: Jul. 5, 2016

(54) LED-LIGHTED WINDOW

(71) Applicant: L.J. Star, Inc., Twinsburg, OH (US)

(72) Inventor: Aarash Navabi, Walpole, MA (US)

(73) Assignee: L.J. Star, Inc., Twinsburg, OH (US)

( * ) Notice: Subject to any disclaimer, the term of this patent is extended or adjusted under 35 U.S.C. 154(b) by 0 days.

(21) Appl. No.: 14/680,452

(22) Filed: Apr. 7, 2015

(65) Prior Publication Data

US 2015/0287899 A1 Oct. 8, 2015

Related U.S. Application Data

(60) Provisional application No. 61/976,077, filed on Apr. 7, 2014.

(51) Int. Cl.
*F21V 33/00* (2006.01)
*H01L 33/42* (2010.01)
*F21Y 101/02* (2006.01)
*F21W 131/40* (2006.01)

(52) U.S. Cl.
CPC .......... *F21V 33/006* (2013.01); *F21W 2131/40* (2013.01); *F21Y 2101/02* (2013.01); *H01L 33/42* (2013.01)

(58) Field of Classification Search
CPC .............. F21V 33/006; F21W 2131/40; F21Y 2101/02; H01L 33/42
See application file for complete search history.

(56) References Cited

U.S. PATENT DOCUMENTS

2014/0098529 A1* 4/2014 Hata .................... H05K 1/0274
362/231

* cited by examiner

*Primary Examiner* — Mary Ellen Bowman
(74) *Attorney, Agent, or Firm* — Brian M. Dingman; Dingman IP Law, PC

(57) ABSTRACT

A lighted window that includes an LED, an anode-side layer or trace of transparent conducting oxide (TCO) overlying a first side of the LED and electrically coupled to the anode of the LED, and a cathode-side layer or trace of TCO overlying a second side of the LED and electrically coupled to the cathode of the LED. There is an anode-side electrical connector that is electrically coupled to the anode-side layer or trace of TCO, electrically insulated from the cathode-side layer or trace of TCO, and extends outside of the anode-side layer or trace of TCO, and a cathode-side electrical connector that is electrically coupled to the cathode-side layer or trace of TCO, electrically insulated from the anode-side layer or trace of TCO, and extends outside of the cathode-side layer or trace of TCO.

11 Claims, 3 Drawing Sheets

LED-LIGHTED WINDOW

CROSS-REFERENCE TO RELATED APPLICATION

This application claims priority of Provisional Patent Application Ser. No. 61/976,077, filed on Apr. 7, 2014.

FIELD

This disclosure relates to lighting an area in front of a window.

BACKGROUND

Typically, light generated in order to illuminate the environment in front of a window has to come from either an external source or a view obstructing device. The problems with the current light sources are that they either obstruct the view of the window or illuminate areas not in the field of view. An external light source is a light emitting device placed outside the field of view of the window and has an identifiable source. The disadvantage of an external light source is that it directs the generated light in directions not parallel to the field of view from the window and illuminates areas not in the field of view of the window. A view obstructing device can generate light entirely within the field of view of the window. However, its size obstructs some of the field of view of the window.

SUMMARY

A light emitting diode (LED) is a semi-conductor light source. An LED light source provides advantages over other standard light sources due to compact size, lifetime, lower energy consumption, fast "on/off" switching, its ability to dim, robustness, its durability, and its reliability. LEDs can also operate in extreme conditions, including low temperatures, and are shock-resistant. LEDs can be used to create multiple light sources that cover a broad range of the light spectrum from infrared to ultraviolet, including the visible light range.

A typical LED circuit has a voltage source connected to the anode and cathode of the LED. The connection between the voltage source and LED is created by electrically conductive wires or traces.

Transparent Conducting Oxide (TCO) is a class of materials made up of doped metal oxides. TCOs are highly transparent and highly conductive. TCOs are fabricated with polycrystalline or amorphous micro structures to maximize their light transmittance. TCOs carry charge due to interstitial metal ion impurities, oxygen vacancies, and doping ions. Common TCOs are Indium Tin Oxide (ITO), Zinc Aluminum Oxide (AZO), and Indium Cadmium Oxide (ICO). TCOs are commonly found in flat panel displays, photovoltaic devices, and smart phones.

In one aspect this disclosure includes a lighted window. The lighted window has two sheets of transparent material that are very closely spaced or touching, face to face. An LED die is located between the two sheets. Power is provided to the anode and cathode of the LED die via TCO. In one example, the sheets of transparent material are layers of TCO and power is provided to the sheets and thereby to the LED. In another example the TCO comprises traces or a thin layer of TCO on the interior faces of the transparent sheets that are in contact or are very close to one another, where these traces/thin layers are in electrical contact with the two sides of the LED die but are not in electrical contact with each other so that they don't short. A result is that the light from the LED comes from the window itself. Since the LED is so small, it does not obstruct the field of view through the window.

In another aspect a lighted window includes an LED, an anode-side layer consisting of transparent conducting oxide (TCO) overlying a first side of the LED and electrically coupled to the anode of the LED, and a cathode-side layer consisting of TCO overlying a second side of the LED and electrically coupled to the cathode of the LED. There is an anode-side electrical connector that is electrically coupled to the anode-side layer of TCO, electrically insulated from the cathode-side layer of TCO and a cathode-side electrical connector that is electrically coupled to the cathode-side layer of TCO, electrically insulated from the anode-side layer of TCO. The electrical connectors are strips located in part between the layers of TCO, and extending outside of the layers of TCO. A transparent, insulating adhesive couples the anode-side and cathode-side TCO layers together, with the LED located between the layers.

The use of a LED in a window that comprises or is composed of a TCO solves the problems of current light sources. LEDs are powerful enough to illuminate the area around them but are very small. The LEDs are small enough that the field of view is not substantially obstructed by the presence of the LED. Due to the placement of the LED inside of the window, the light generated by the LED is only directed to areas within the field of view of the window. The use of TCOs to create the electric circuit between a voltage source and the LED removes the need for view obstructing wires or traces while conducting enough electrical current to power the LED. The TCO transparency allows it to both transmit the light generated by the LED and give a clear field of view through the window. Due in part to the light transmittance of the TCO, and the extremely small size of the LED, the source of the light is not easily identifiable, and the light generated is not concentrated at a single point.

When an electric current is applied to the window, the LED will produce light, illuminating the field of view of the window without obstruction.

The TCO layers or traces are transparent, allowing for light to pass through. The LED is small enough not to substantially affect the field of view and powerful enough to produce enough light to illuminate the area in front of it. The TCO conducts the electric current required by the LED to generate light, eliminating the need for view-obstructing wires. The opposed layers (of TCO, plastic, glass or another substantially transparent material) and LED can be held in place by a transparent insulating adhesive. Due to the light being produced internally within the window, the source is not easily identifiable, and the light is not concentrated to a single area.

The result is a window that can illuminate its field of view without an external light source or obstruction of the field of view. The effectiveness of the illumination of the window can depend on the LED used, the power provided to the LED, the environmental visibility, the area being illuminated, or other conditions that affect the visibility of the surrounding environment.

In summary, the present disclosure allows the generation and transmittance of light through a window without substantially obstructing the field of the window, without illuminating areas not in the field of view of the window, and without an easily identifiable light source.

IDENTIFICATION OF DRAWING ELEMENTS

FIG. 1

Figure 1:
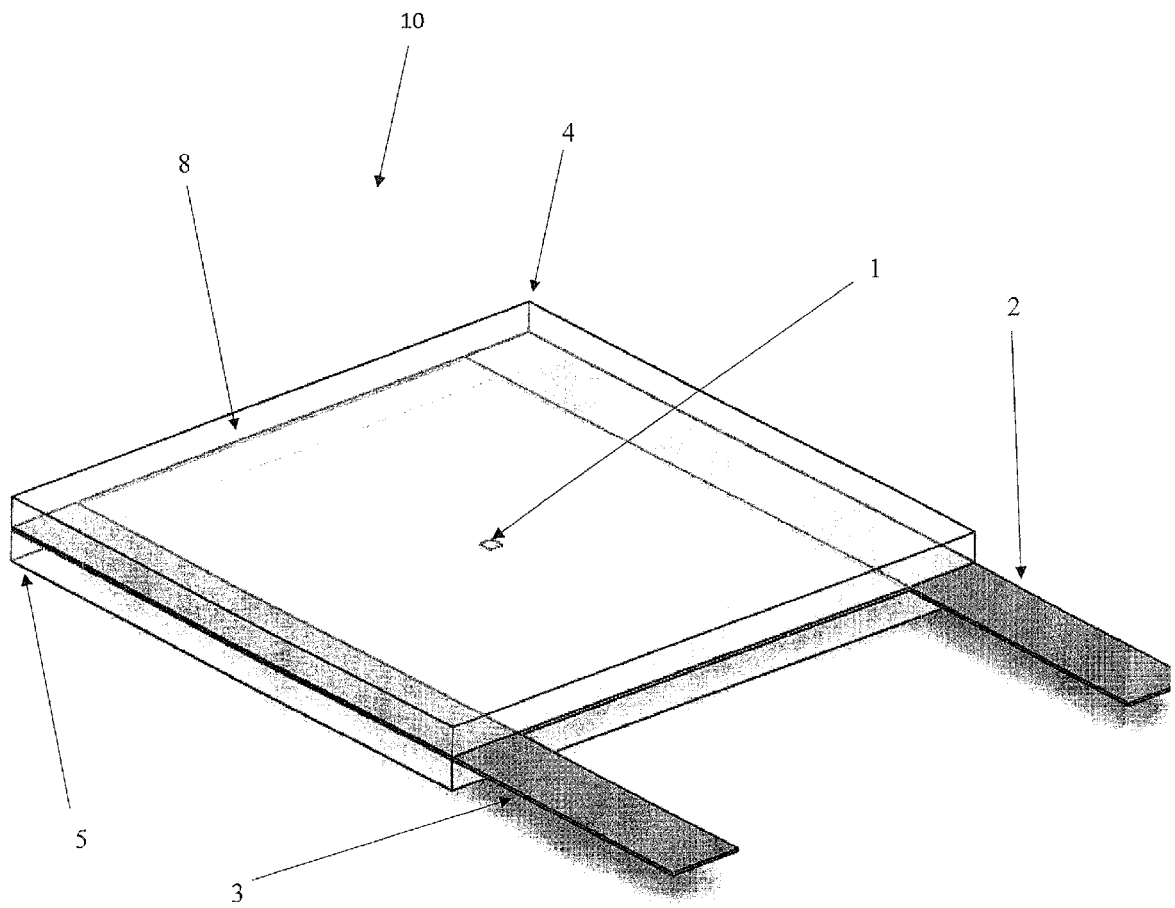
FIG. 1: Perspective view of a LED-lighted window.

1: LED
2: Cathode side electrical connector
3: Anode side electrical connector
4: Anode side TCO layer
5: Cathode side TCO layer
8: Transparent insulating adhesive
10: LED-Lighted Window

Figure 2:
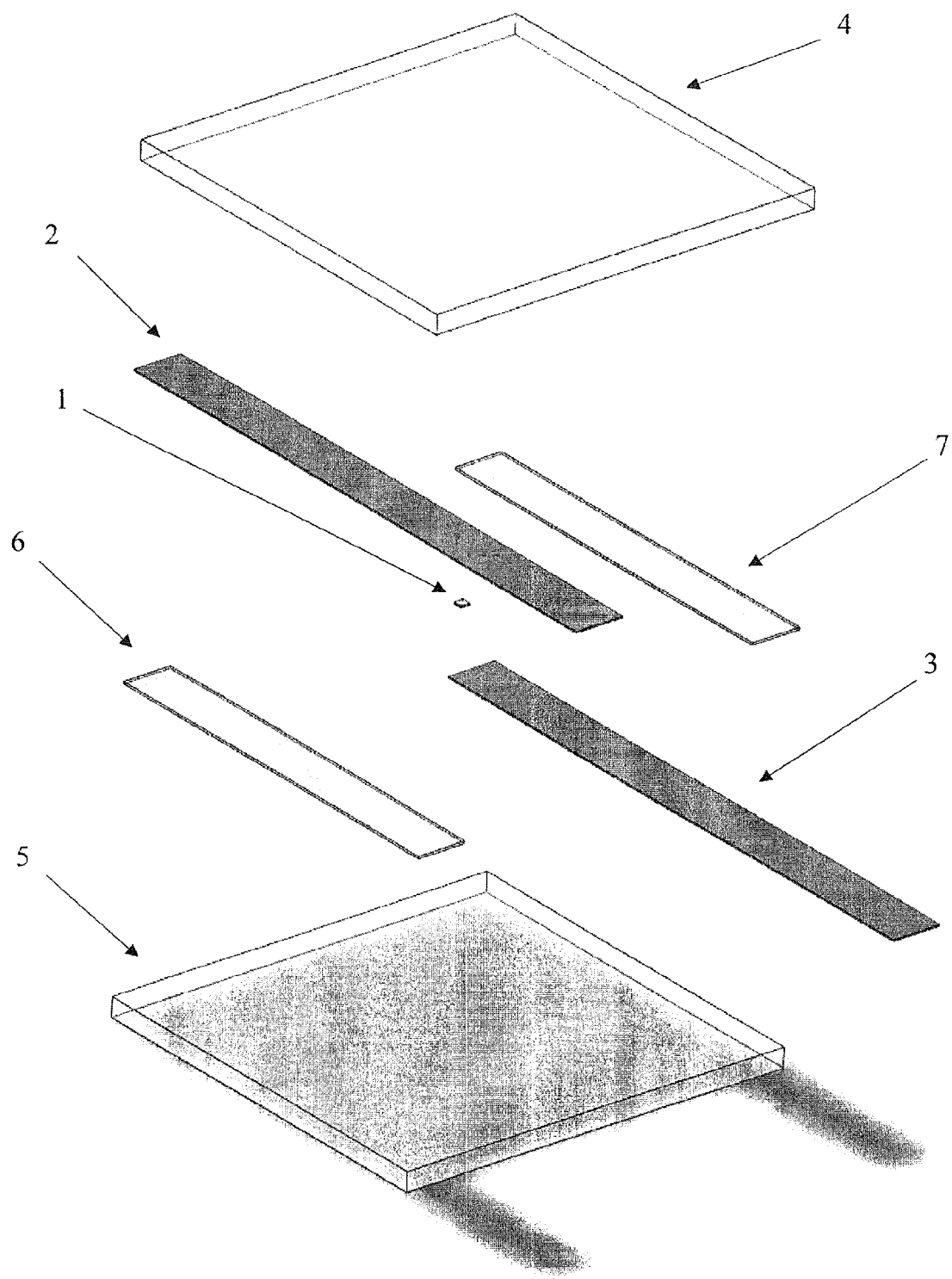
FIG. 2: Exploded view of the LED-lighted window.

FIG. 2: Image of Window (Exploded)

1: LED
2: Cathode side electrical connector
3: Anode side electrical connector
4: Anode side TCO layer
5: Cathode side TCO layer
6: Cathode side insulating layer
7: Anode side insulating layer

Figure 3:
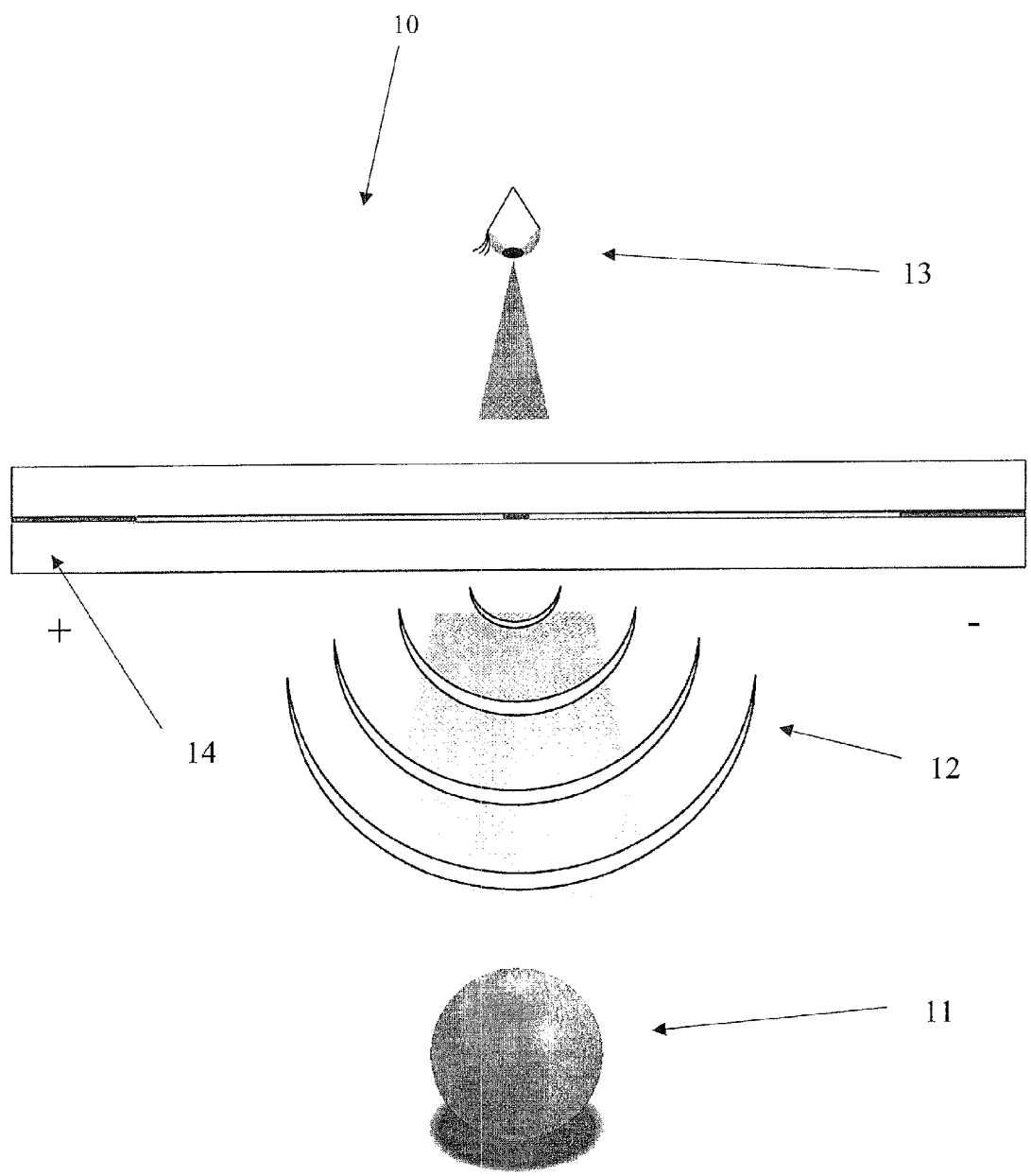
FIG. 3: Side view of the LED-lighted window.

FIG. 3: Image of Window in Operation

10: LED-Lighted Window
11: Object being viewed
12: Light from LED
13: Vision of user
14: Voltage applied to window

DETAILED DESCRIPTION

Featured in this disclosure is a lighted window. The lighted window has two sheets of transparent material that are very closely spaced or touching, face to face. An LED die is located between the two sheets. Power is provided to the anode and cathode of the LED die via TCO. In one example, the sheets of transparent material are themselves layers of TCO, and power is provided to the sheets and through the sheets to the LED. In another example the TCO comprises a thin layer of TCO on the interior faces of the transparent sheets that are in contact or are very close to one another, where these TCO layers are in electrical contact with the two sides of the LED die but are insulated from one another. Power is provided to the thin layers of TCO that are on the sheets. This provides power to the LED. In yet another example the TCO comprises traces of TCO on the interior faces of the transparent sheets that are in contact or are very close to one another, where these TCO traces are in electrical contact with the two sides of the LED die but are insulated from one another. Power is provided to the TCO traces that are on the sheets. This provides power to the LED. In yet another example the TCO comprises traces of TCO embedded in the interior of one or both of the transparent sheets that are in contact or are very close to one another, where these TCO traces are in electrical contact with the two sides of the LED die but are insulated from one another. Power is provided to the TCO traces. This provides power to the LED. Both sheets of the window do not need to be designed in the same way, as long as the TCO is present in a manner that provides the power to the LED.

The examples herein relate to an LED that is powered by electricity that is conducted by layers or traces of TCO. The layers and/or traces of TCO are electrically coupled to the LED. The TCO is electrically conductive and has a high transmittance of light. The LED used is powerful enough to provide illumination of the surrounding environment. As one non-limiting example, the LED could be an EZ1400 LED die from Cree, Inc. This produces about 200 lm/watt in a Lambertian radiation pattern, in a package that is about 1380 microns square and about 170 microns in height. Other dies could be used; today some are as small as 980×980 microns. Efficient LED dies have several advantages; they are cooler, and the TCO traces can be smaller for the same light production as less efficient dies.

Window 10 is one non-limiting example of the disclosure. Window 10 is shown in the drawings. LED 1 is sandwiched by TCO layers 4 and 5. In this example, layers 4 and 5 consist entirely of TCO. Electrical conductors 2 and 3, which may be thin layers or films of a conductor such as copper, are applied in a manner such that they conduct the voltage to the two TCO layers so as to accomplish the anode side and cathode side conductivity to and from the LED. Insulative layers 6 and 7 are placed over or above strips 6 and 7 so as to insulate the strips from the layer they are not electrically coupled to. For example, the cathode strip needs to be insulated from the anode TCO layer. An appropriate voltage source (not shown) is electrically coupled to connectors 2 and 3.

Because TCO is highly transparent to visible light, layers 4 and 5 accomplish both the necessary electrical conductivity as well as acting as panes of the window. A transparent non-conductive adhesive (not shown) can be used to adhere layers 4 and 5 together, while preventing electrical connectivity (i.e., shorting) between layers 4 and 5. This creates a unified window structure as shown in FIGS. 1 and 3. Objects on one side of window 10 can be view by a user on the other side, as shown in FIG. 3.

As described above, alternatives (not shown in the drawings) include using for the panes, sheets of glass, plastic or another transparent material that is not TCO. The TCO is applied to the surfaces of the panes that are in contact with the LED die and/or could be embedded in one or both layers. The TCO can be applied or embedded as a thin layer or film, or as traces. For example, the TCO can cover all or less than all of the face of the window pane. The TCO is located and applied such that it is electrically coupled to both the LED and the power source.

One non-limiting use of the subject lighted window is as an observation window in a bioreactor. Some bioreactors need to have viewing ports/observation windows so that the contents can be visually monitored. The subject lighted window casts light in the field of view of the window without the need for any external light source, or a light source that in any way obstructs the view through the window. Another example would be its use in a camera with a sensor, light and window or lens. The three can be combined into one assembly, with the LED in line with the sensor.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the following claims.

What is claimed is:

1. A lighted window, comprising:
   an LED;
   an anode-side layer or trace of transparent conducting oxide (TCO) overlying a first side of the LED and electrically coupled to the anode of the LED;
   a cathode-side layer or trace of TCO overlying a second side of the LED and electrically coupled to the cathode of the LED;

an anode-side electrical connector that is electrically coupled to the anode-side layer or trace of TCO, electrically insulated from the cathode-side layer or trace of TCO; and a cathode-side electrical connector that is electrically coupled to the cathode-side layer or trace of TCO, electrically insulated from the anode-side layer or trace of TCO.

2. The lighted window of claim 1 wherein the anode side TCO and cathode side TCO each comprise a layer of TCO, and wherein the LED is located between these layers.

3. The lighted window of claim 2 further comprising a transparent, insulating adhesive that couples the anode-side and cathode-side TCO layers together, with the LED located between the layers.

4. The lighted window of claim 3 wherein the electrical connectors are strips located in part between the layers of TCO, and extending outside of the layers of TCO.

5. The lighted window of claim 2 wherein the anode side layer and the cathode side each consist entirely of TCO.

6. The lighted window of claim 1 further comprising two transparent sheets of a material other than TCO, wherein the anode side TCO is on a face of one sheet and the cathode side TCO is on a face of the other sheet, and wherein the LED is located between the two sheets.

7. The lighted window of claim 6 wherein the anode side and cathode side TCO each comprise a thin layer of TCO on a sheet.

8. The lighted window of claim 6 wherein the anode side and cathode side TCO each comprise a trace of TCO on a sheet.

9. The lighted window of claim 8 further comprising a transparent adhesive that couples the two sheets together.

10. The lighted window of claim 1 wherein the anode-side electrical connector extends outside of the anode-side layer or trace of TCO, and the cathode-side electrical connector extends outside of the cathode-side layer or trace of TCO.

11. A lighted window, comprising:

an LED;

an anode-side layer consisting of transparent conducting oxide (TCO) overlying a first side of the LED and electrically coupled to the anode of the LED;

a cathode-side layer consisting of TCO overlying a second side of the LED and electrically coupled to the cathode of the LED;

an anode-side electrical connector that is electrically coupled to the anode-side layer of TCO, electrically insulated from the cathode-side layer of TCO;

a cathode-side electrical connector that is electrically coupled to the cathode-side layer of TCO, electrically insulated from the anode-side layer of TCO;

wherein the electrical connectors are strips located in part between the layers of TCO, and extending outside of the layers of TCO; and a transparent, insulating adhesive that couples the anode-side and cathode-side TCO layers together, with the LED located between the layers.

* * * * *